United States Patent [19] [11] Patent Number: 4,987,430
Clarisse et al. [45] Date of Patent: Jan. 22, 1991

[54] ORGANIC SEMICONDUCTOR DEVICE BASED ON PHTHALOCYANINE

[76] Inventors: Christian Clarisse, 13 Résidence de Pors-Ty-Olu, Saint-Quay Perros, 22700 Perros-Guirec; Michel Le Contellec, 43 Résidence du Roux, 22300 Lannion; Marie-Thérése Riou, rue d'Estienne d'Orves, 22700 Perros-Guirec, all of France

[21] Appl. No.: 268,506

[22] Filed: Nov. 8, 1988

[30] Foreign Application Priority Data

Nov. 9, 1987 [FR] France .................. 87 15490

[51] Int. Cl.⁵ .................. H01L 29/28
[52] U.S. Cl. .................. 357/8; 357/23.1; 357/65
[58] Field of Search .......... 357/865, 23.1, 65

[56] References Cited

U.S. PATENT DOCUMENTS 4,164,431 8/1979 Tang .................. 357/8

FOREIGN PATENT DOCUMENTS 2031175 2/1987 Japan .................. 357/8

OTHER PUBLICATIONS

Toute L'Electronique, No. 513, Apr. 1986, p. 87, FET Organique.
J. Am. Chem. Soc., vol. 109, No. 17, pp. 5119–5122, 1987, Turek et al., A New Series of Molecular Semiconductors: Phthalocyanine Radicals.
EP-A-0 076 060 (ICI), p. 4, line 10–p. 5, line 24; p. 8, line 29–p. 11, line 15; Example 5; FIGS. 8a, 8b.
Synthetic Metals, Tome 18, 1987, pp. 683–688, Lausanne, CH; J. J. Andre et al.: "Molecular Semiconductors and Junction Formation: Phthalocyanine Derivatives" en entier.

Primary Examiner—Andrew J. James
Assistant Examiner—Courtney A. Bowers

[57] ABSTRACT

The present invention relates to an organic semiconductor device based on phthalocyanine. According to the invention, the device comprises a substrate constituted by a layer (10) of a conductive material covered by a layer (20) of a dielectric material, and a coating deposited on the layer of dielectric material and comprising an extrinsic molecular semiconductor (30) constituted by a monophthalocyanine of a divalent metal or by a hydrogenated monophthalocyanine, and an intrinsic molecular semiconductor (40) constituted by a phthalocyanine giving rise to free radicals.

29 Claims, 4 Drawing Sheets

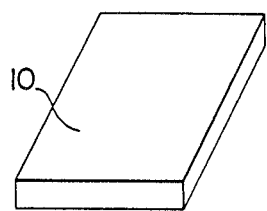
FIG_1A
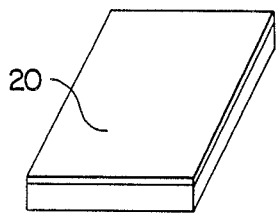
FIG_1B
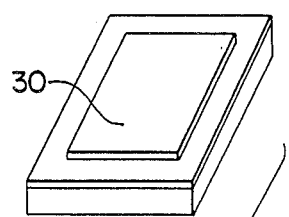
FIG_1C
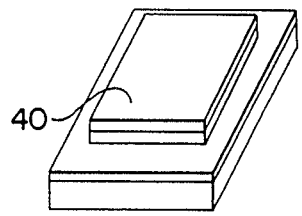
FIG_1D
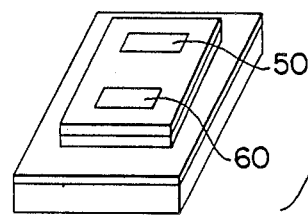
FIG_1E
FIG_1
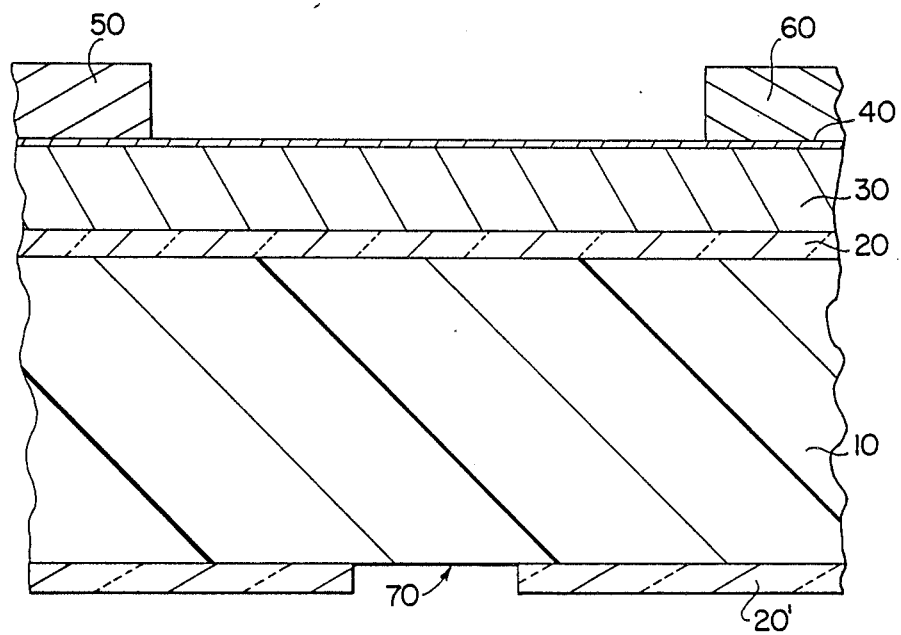
FIG_2

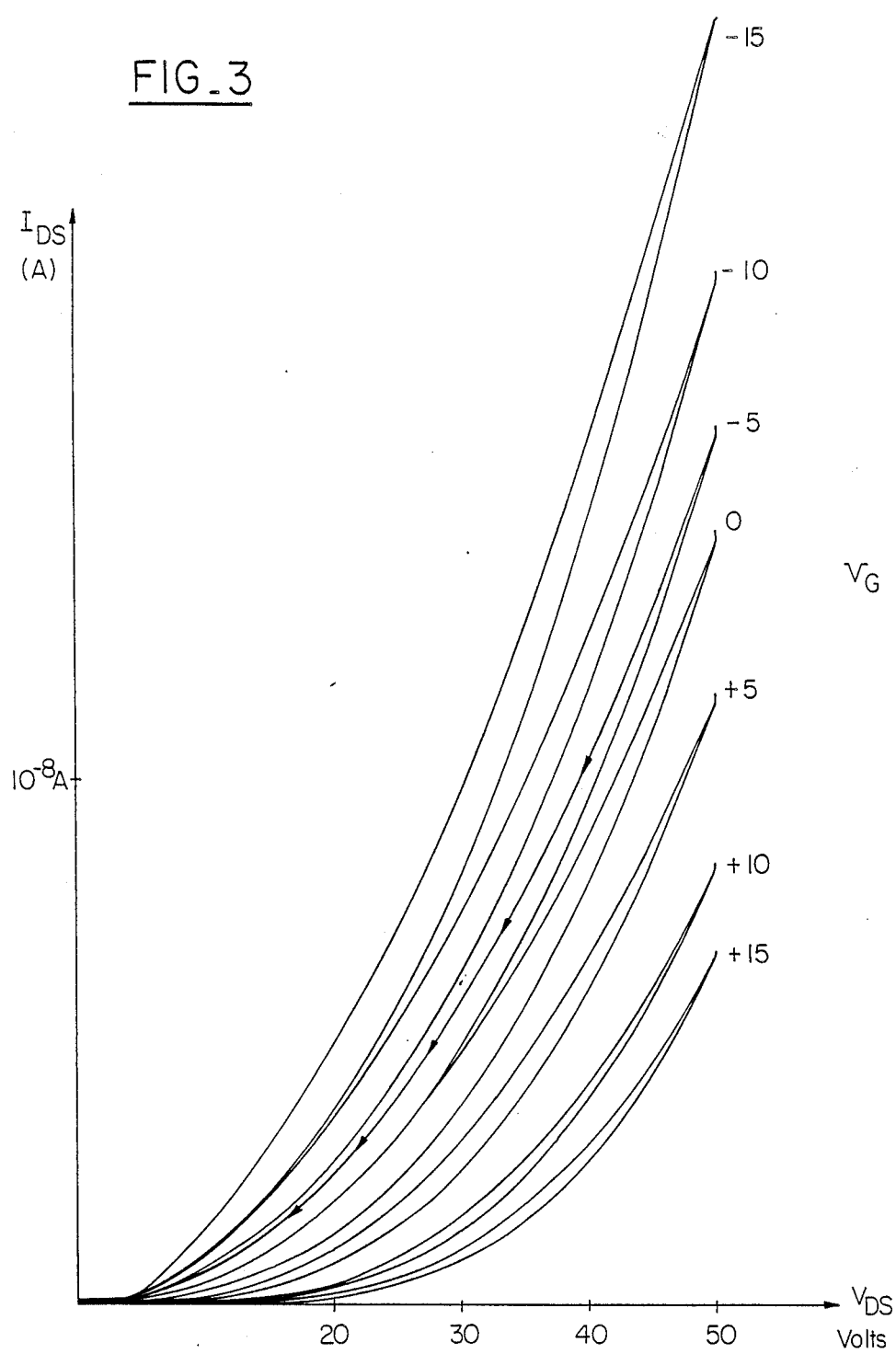
FIG_3

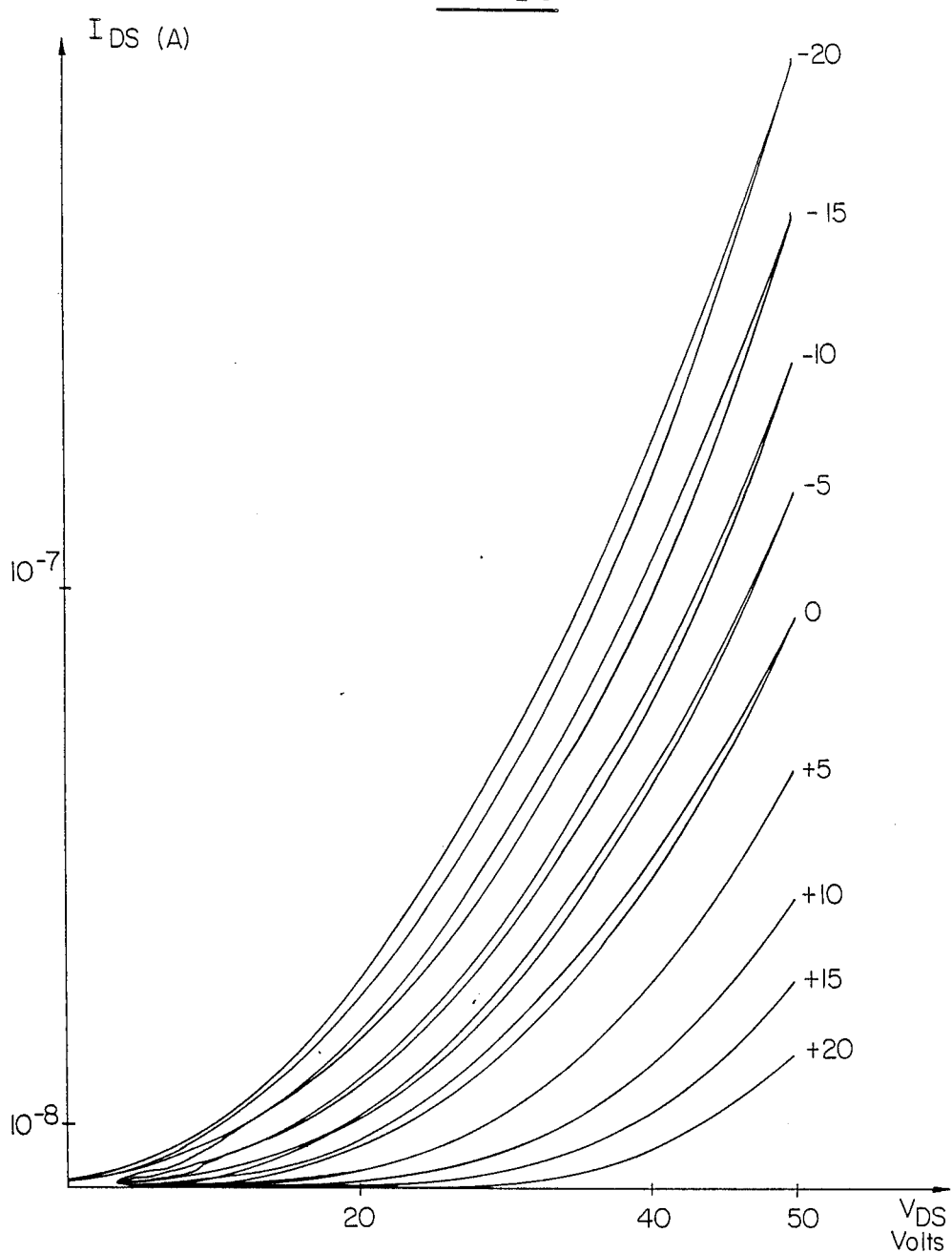
FIG_5

ORGANIC SEMICONDUCTOR DEVICE BASED ON PHTHALOCYANINE

The present invention relates to organic semiconductor based on phthalocyanine.

BACKGROUND OF THE INVENTION

A great deal of research has been performed on the electrical properties of the phthalocyanines.

The results of this research are to be found, for example, in the following documents: (1) Japanese Pat. Nos. JP 047 295, JP 047 296, and JP 047 297, dated Mar. 9 1985, (2) "Formation of MIS Structure in Organic Cell Al/Pb - Phthalocyanine/ITO" Kanayama et al - Japanese Journal of Applied Physics - Volume 22, No. 2, February 1983, pages 348-350, (3) "Phthalocyanineelectrolyte Schottky - junction devices" - Loufty et al - Can. J. Chem., Volume 61, 1983 - pages 72–77, (4) "Molecular material based junctions: Formation of a Schottky contact with metallophthalocyanine thin films doped by the cosublimation method" - Maitrat et al - J. Applied Physics, 60, Oct. 1, 1987, pages 2396–2400, (5) "Molecular semiconductors and junction formation: phthalocyanine derivatives," Andre et al - Synthetic Metals, 18 (1987), 683-688.

These documents show that in certain configurations and/or under certain doping conditions, phthalocyanines have semiconductor properties enabling devices to be made which act as diodes.

However, the phthalocyanine-based devices proposed heretofore are very unstable in air, as mentioned in the above-mentioned documents. Further, it has been very difficult in the past to obtain phthalocyanine-based films which are thin and uniform.

An object of the present invention is to eliminate the drawbacks of the prior art and to propose a structure suitable for defining a transistor type organic semiconductor device.

SUMMARY OF THE INVENTION

This object is achieved, according to the present invention, by a semiconductor device comprising:
a substrate constituted by:
a layer of semiconductor material, covered by;
a layer of dielectric material; and
a coating deposited on the layer of dielectric material and constituted by:
an extrinsic molecular semiconductor constituted by a monophthalocyanine of a divalent metal or by a hydrogenated monophthalocyanine; and
an intrinsic molecular semiconductor constituted by a phthalocyanine giving rise to free radicals.

BRIEF DESCRIPTION OF THE DRAWINGS

Examples of the invention is described with reference to the accompanying drawings, in which:

FIGS. 1A, 1B, 1C, 1D, and 1E show five successive stages in the fabrication of a semiconductor device in accordance with the present invention;

FIG. 2 is a diagrammatic section view through the same device; and

FIGS. 3, 4, 5, and 6 are characteristic curves taken from various semiconductor devices in accordance with the invention and of the field effect transistor type. More precisely, the curves in FIGS. 3 to 6 represent the current flowing between the drain and the source of the device as a function of the voltage between the drain and the source, for various grid voltages.

MORE DETAILED DESCRIPTION

Figure 4:
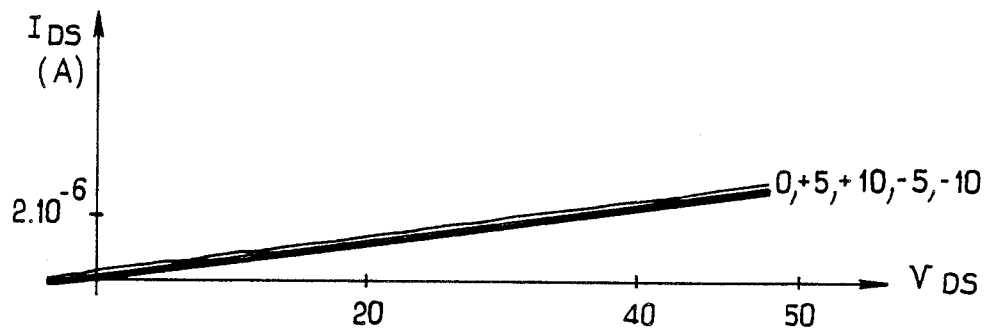

Accompanying FIG. 1A shows a layer 10 of a substrate semiconductor material. The layer 10 may be constituted by doped silicon, for example.

As shown in FIG. 1B, the layer 10 should be covered with a layer of dielectric material 20. The layer of dielectric material 20 may be obtained, for example, by oxidizing the silicon of the layer 10, thereby obtaining a layer 20 made of $SiO_2$.

The dielectric layer 20 is advantageously about $1.10^{-7}$ meters (m) thick.

In a variant, the layer 10 may be constituted by doped silicon and the dielectric layer 20 by $Si_3N_4$.

As shown in FIGS. 1C and 1D, a coating is deposited on the layer of dielectric material 20. The said coating is constituted by an extrinsic molecular semiconductor 30 and by an intrinsic molecular semiconductor 40 which is constituted by a phthalocyanine giving rise to free radicals.

The term "phthalocyanine giving rise to free radicals" is used to designate a phthalocyanine which spontaneously forms acceptors or donors (and consequently possesses free electrons).

In the context of the invention, the extrinsic molecular semiconductor 30 is constituted by a monophthalocyanine of a divalent metal or by a hydrogenated monophthalocyanine.

After much research and numerous tests, the inventors have determined that in order to give satisfaction in combination with the extrinsic molecular semiconductor 30 formed by a monophthalocyanine of a divalent metal or by a hydrogenated monophthalocyanine, the intrinsic molecular semiconductor 40 formed by a phthalocyanine giving rise to free radicals should be formed either by a rare earth diphthalocyanine, e.g. based on lanthanum or on lutetium, or by yttrium or scandium diphthalocyanine, or by an actinide diphthalocyanine, or else by lithium phthalocyanine. All of these compounds spontaneously possess the properties of an intrinsic molecular semiconductor suitable for doping the extrinsic molecular semiconductor material 30 formed by a monophthalocyanine of a divalent metal or by a hydrogenated monophthalocyanine.

In the context of the present invention, the coating constituted by an extrinsic molecular semiconductor 30 and by an intrinsic molecular semiconductor 40 is deposited by vacuum evaporation onto the layer 20 of dielectric material on the substrate.

The extrinsic molecular semiconductor 30 and the intrinsic molecular semiconductor 40 may be deposited on the layer of dielectric material 20 on the substrate by simultaneous cosublimation.

In a variant, the extrinsic semiconductor 30 and the intrinsic molecular semiconductor 40 may be deposited on the layer of dielectric material 20 on the substrate by consecutive sublimation, with the extrinsic molecular semiconductor being preferably the first to be evaporated.

When the extrinsic molecular semiconductor 30 and the intrinsic molecular semiconductor 40 are sublimated consecutively, it is preferable to provide for a subsequent stage in which the device is annealed in order to enhance diffusion of the intrinsic molecular semiconductor 40.

As shown in FIG. 1E, two separate areas 50 and 60 of electrically conductive material are subsequently deposited on the coating 40. These two areas 50 and 60 serve as the source and the drain of the device. In parallel, a contact 70 serving as the grid is made on the layer of semiconductor material 10 on its side opposite to the dielectric layer 20.

If the dielectric layer is formed by oxidizing the chip 10, then the contact 70 is made on the layer 10 after locally etching away the oxidized layer, as shown diagrammatically in FIG. 2. Such etching and metallizing stages are conventional per se and are not described in greater detail below.

The extrinsic semiconductor layer constituted by a monophthalocyanine of a divalent metal or by a hydrogenated monophthalocyanine is preferably between $1.10^{-7}$ m and $5.10^{-7}$ m thick.

The inventors have observed that the above-defined organic semiconductor device shown in FIGS. 1 and 2 presents a field effect when the intrinsic molecular semiconductor 40 constituted by a phthalocyanine that gives rise to free radicals is less than $1.10^{-7}$ m thick. In other words, when the layer 40 is less than $1.10^7$ m thick, it is observed that the current flowing through the device between the drain 50 and the source 60 increases exponentially with the voltage applied between the source and the drain, and with the current increasing for a reduction in the potential applied to the grid 70.

In contrast, the inventors have observed that the above-defined organic semiconductor device shown in FIGS. 1 and 2 presents ohmic behavior when the intrinsic semiconductor layer 40 constituted by a phthalocyanine giving rise to free radicals is more than $1.10^{-7}$ m thick. In other words, when the layer 40 is more than $1.10^{-7}$ m thick, it is observed that the current flowing through the device between the drain 50 and the source 60 increases linearly with the voltage applied between the source and the drain, with the drain-source current being substantially independent of the potential applied to the grid 70.

Four examples of an organic semiconductor device in accordance with the present invention are now described.

EXAMPLE 1

An N-doped chip of silicon 10 having a conductivity of $10^2 \Omega^{-1} cm^{-1}$ is thermally oxidized until a layer of silica is obtained which is about $10^{-7}$ m thick.

A layer 30 of nickel phthalocyanine is deposited on the silica layer 20 by vacuum evaporation to a thickness of about $3.10^{-7}$ m, at a deposition rate of about $3.10^{-10}$ m/s.

Thereafter a layer of scandium diphthalocyanine is deposited to a thickness of about 2.10-8 m at a rate of about $2.10^{-10}$ m/s.

Gold source and drain contacts 50 and 60 are then made on the layer 40 of scandium diphthalocyanine. The contacts 50 and 60 are about $3.10^{-7}$ m thick. They have an area of about $150.10^{-6}$ m $\times 150.10^{-6}$ m. The gap between the two contacts is about $50.10^{-6}$ m. The contacts 50 and 60 serving as source and drain are preferably made by vacuum evaporation.

A grid contact 70 is formed on the side of the silicon chip 10 which is opposite to the side on which the phthalocyanines 30 and 40 are deposited, by chemically etching the oxide layer.

FIG. 3 shows the value of the current passing between the source and drain contacts 50 and 60 as a function of the applied source-drain voltage for various different values of grid voltage. FIG. 3 shows that the device is capable of modulating current. It behaves like a transistor of the field effect type. The current $I_{DS}$ passing between the source and drain contacts 50 and 60 increases exponentially with the voltage $V_{DS}$ applied between the source and the drain, with the value of the current being increased by decreasing the potential of the grid $V_G$.

EXAMPLE 2

In a manner similar to above Example 1, a chip of N-doped silicon is thermally oxidized to obtain a layer of silica having a thickness of about $10^{-7}$ m, after which a layer of nickel phthalocyanine is deposited to a thickness of about $3.10^{-7}$ m by vacuum evaporation onto the layer of silica. However, in Example 2, the layer of subsequently deposited scandium diphthalocyanine has a thickness of about $2.10^{-7}$ m.

FIG. 4 shows the current passing between the source and drain contacts 50 and 60 as a function of the applied sourcedrain voltage, for various different values of grid voltage. FIG. 4 shows that the device, which has an intrinsic molecular semiconductor which is more than $10^{-7}$ m thick presents ohmic behavior. The current $I_S$ increases substantially linearly with voltage $V_{DS}$. In addition, the current $I_{DS}$ is substantially independent of the grid voltage $V_G$.

It may also be observed that the current $I_{DS}$ delivered in Example 2 is about 100 times the current delivered in Example 1.

EXAMPLE 3

In a manner similar to Examples 1 and 2, a chip 10 of N-doped silicon is thermally oxidized in order to obtain a layer of silica 20 having a thickness of about $10^{-7}$ m, after which a layer of nickel phthalocyanine is deposited on the layer of silica to a thickness of about $3.10^{-7}$ m by evaporation in a vacuum.

Thereafter a layer 40 of yttrium diphthalocyanine is deposited on the layer 30 of nickel phthalocyanine to a thickness of about $3.10^{-8}$ m, by evaporation in a vacuum.

FIG. 5 shows the value of the current passing between the source and drain contacts 50 and 60 as a function of the applied source drain voltage for various different values of grid voltage $V_G$.

FIG. 5 shows that the device made in accordance with Example 3 is capable of modulating current and behaves like a field effect transistor, as in Example 1.

EXAMPLE 4

A chip 10 of N-doped silicon is thermally oxidized to obtain a layer of silica having a thickness of about $10^{-7}$ m.

A layer of zinc phthalocyanine is deposited on the layer of silica 10 to a thickness of about $3.10^{-7}$ m. Thereafter a layer of lutetium diphthalocyanine is deposited on the layer 30 to a thickness of about $3.10^{-8}$ m.

Figure 6:
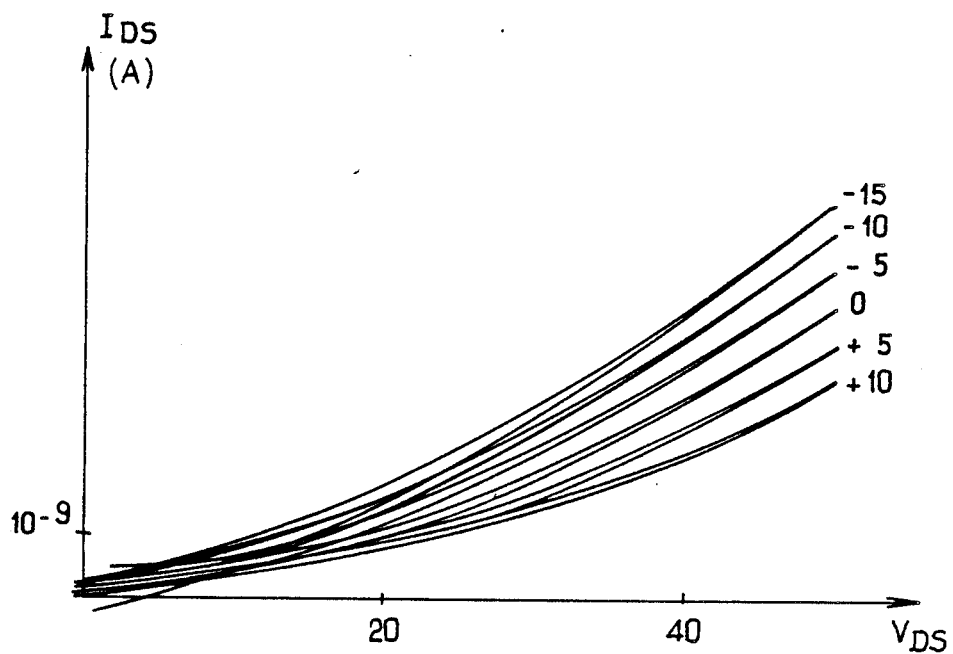

FIG. 6 shows the value of the current passing between the source and drain contacts 50 and 60 as a function of the applied source-drain voltage for various different values of grid voltage. FIG. 6 shows that the device is capable of modulating current and that it behaves like a field effect transistor in a manner similar to above Examples 1 and 3.

An organic semiconductor device in accordance with the invention may be made on the basis of any phthalocyanine which is capable of sublimation.

Naturally, the present invention is not limited to the particular embodiments described but covers any variant coming within its scope.

In particular, it should be observed that the present invention is not limited to making field effect transistors.

It also extends to making variable resistances or charge transfer devices.

We claim:

1. A semiconductor device comprising: a substrate constituted by:
   a layer of semiconductor material, covered by;
   a layer of dielectric material; and a coating deposited on the layer of dielectric material and constituted by:
   an extrinsic molecular semiconductor constituted by a monophthalocyanine of a divalent metal or by a hydrogenated monophthalocyanine; and
   an intrinsic molecular semiconductor constituted by a phthalocyanine giving rise to free radicals.

2. A device according to claim 1, wherein the intrinsic molecular semiconductor constituted by a phthalocyanine giving rise to free radicals is a rare earth diphthalocyanine.

3. A device according to claim 1, wherein the intrinsic molecular semiconductor constituted by a phthalocyanine giving rise to free radicals is yttrium or scandium diphthalocyanine.

4. A device according to claim 1, wherein the intrinsic molecular semiconductor constituted by a phthalocyanine giving rise to free radicals is an actinide diphthalocyanine.

5. A device according to claim 1, wherein the intrinsic molecular semiconductor constituted by a phthalocyanine giving rise to free radicals is lithium phthalocyanine.

6. A device according to claim 1, wherein the substrate is constituted by a layer of silicon covered by a layer of $SiO_2$, with said layer $SiO_2$ constituting the layer of dielectric material.

7. A device according to claim 1, wherein the substrate is constituted by a layer of silicon covered by a layer of $Si_3N_4$, with the layer of $Si_3N_4$ constituting the layer of dielectric material.

8. A device according to claim 1, wherein two separate areas of electrically conductive material are deposited on the coating.

9. A device according to claim 8, wherein the two separate areas of electrically conductive material deposited on the coating serve as a source and as a drain, while a contact made on the layer of semiconductor material constituting the substrate serves as a gate electrode.

10. A device according to claim 9, wherein the coating deposited on the layer of dielectric material includes the intrinsic molecular semiconductor layer constituted by the phthalocyanine giving rise to free radicals and having a thickness of less than $1 \times 10^{-7}$ m.

11. A device according to claim 7, wherein the coating deposited on the layer of dielectric material includes the intrinsic molecular semiconductor layer constituted by the phthalocyanine give rise to free radicals and having a thickness of greater than $1 \times 10^{-7}$ m.

12. A device according to claim 1, wherein the coating deposited on the layer of dielectric material includes the extrinsic molecular semiconductor layer constituted by a monophthalocyanine of a divalent metal or by a hydrogenated monophthalocyanine, and having a thickness lying in the range $1 \times 10^{-7}$ m and $5 \times 10^{-7}$ m.

13. A semiconductor device constituting a transistor of the field effect type and comprising:
   a substrate constituted by:
   a layer of a conductor material covered by:
   a layer of a dielectric material;
   a coating deposited onto the layer of dielectric material and comprising:
   an extrinsic molecular semiconductor constituted by a monophthalocyanine of a divalent metal or by a hydrogenated monophthalocyanine; and
   by an intrinsic molecular semiconductor constituted by a phthalocyanine giving rise to free radicals and having a thickness of less than $1 \times 10^{-7}$ m;
   two separate areas of electrically conductive material deposited on the coating an serving respectively as a source and as a drain; and a contact made with the layer of conductor material in the substrate and serving as a gate electrode.

14. A semiconductor device comprising: a substrate constituted by:
   a layer of conductor material, covered by;
   a layer of dielectric material; and a coating deposited on the layer of dielectric material and constituted by:
   an extrinsic molecular semiconductor constituted by a monophthalocyanine of a divalent metal or by a hydrogenated monophthalocyanine; and
   an intrinsic molecular semiconductor constituted by an yttrium or scandium diphthalocyanine.

15. A device according to claim 14, wherein the substrate is constituted by a layer of silicon covered by a layer of $SiO_2$, with said layer $SiO_2$ constituting the layer of dielectric material.

16. A device according to claim 14, wherein the substrate is constituted by a layer of silicon covered by a layer of $Si_3N_4$ constituting the layer of dielectric material.

17. A device according to claim 14, wherein two separate areas of electrically conductive material are deposited on the coating.

18. A device according to claim 17, wherein the two separate areas of electrically conductive material deposited on the coating serve as a source and as a drain, while a contact made on the layer of semiconductor material constituting the substrate serves as a gate electrode.

19. A device according to claim 18, wherein the coating deposited on the layer of dielectric material includes the intrinsic molecular semiconductor layer constituted by the phthalocyanine giving rise to free radicals and having a thickness of less than $1 \times 10^{-7}$ m.

20. A device according to claim 17, wherein the coating deposited on the layer of dielectric material includes the intrinsic molecular semiconductor layer constituted by the phthalocyanine giving rise to free radicals and having a thickness of greater than $1 \times 10^{-7}$ m.

21. A device according to claim 14, wherein the coating deposited on the layer of dielectric material includes the extrinsic semiconductor layer constituted by a monophthalocyanine of a divalent metal or by hydrogenated monophthalocyanine, and having a thickness lying in the range $1 \times 10^{-7}$ m and $5 \times 10^{-7}$ m.

22. A semiconductor device comprising: a substrate constituted by:

a layer of conductor material, covered by;

a layer of dielectric material; and a coating deposited on the layer of dielectric material and constituted by:

an extrinsic molecular semiconductor constituted by a monophthalocyanine of a divalent metal or by a hydrogenated monophthalocyanine; and an intrinsic molecular semiconductor constituted by an actinide diphthalocyanine.

23. A device according to claim 22, wherein the substrate is constituted by a layer of silicon covered by a layer of $SiO_2$, with said layer $SiO_2$ constituting the layer of dielectric material.

24. A device according to claim 22, wherein the substrate is constituted by a layer of silicon covered by a layer of $Si_3N_4$, with the layer of $Si_3N_4$ constituting the layer of dielectric material.

25. A device according to claim 22, wherein two separate areas of electrically conductive material are deposited on the coating.

26. A device according to claim 25, wherein the two separate areas of electrically conductive material deposited on the coating serve as a source and as a drain, while a contact made on the layer of semiconductor material constituting the substrate serves as a gate electrode.

27. A device according to claim 26, wherein the coating deposited on the layer of dielectric material includes the intrinsic molecular semiconductor layer constituted by the phthalocyanine giving rise to free radicals and having a thickness of less than $1 \times 10_{-7}$ m.

28. A device according to claim 25, wherein the coating deposited on the layer of dielectric material includes the intrinsic molecular semiconductor layer constituted by the phthalocyanine giving rise to free radicals and having a thickness of greater than $1 \times 10_{-7}$ m.

29. A device according to claim 22, wherein the coating deposited on the layer of dielectric material includes the extrinsic semiconductor layer constituted by a monophthalocyanine of a divalent metal or by a hydrogenated monophthalocyanine, and having a thickness lying in the range $1 \times 10 - 7$ m and $5 \times 10_{-7}$ m.

* * * * *